United States Patent
Vinogradov

(10) Patent No.: US 10,599,896 B1
(45) Date of Patent: Mar. 24, 2020

(54) OPTICAL ARRANGEMENT FOR USE IN IMAGING ENGINES AND DEVICES USING IMAGING ENGINES

(71) Applicant: Zebra Technologies Corporation, Lincolnshire, IL (US)

(72) Inventor: Igor Vinogradov, Oakdale, NY (US)

(73) Assignee: Zebra Technologies Corporation, Lincolnshire, IL (US)

( * ) Notice: Subject to any disclaimer, the term of this patent is extended or adjusted under 35 U.S.C. 154(b) by 0 days.

(21) Appl. No.: 16/221,732

(22) Filed: Dec. 17, 2018

(51) Int. Cl.
| | |
|---|---|
| *G06K 7/10* | (2006.01) |
| *G02B 27/09* | (2006.01) |
| *H04N 5/225* | (2006.01) |
| *H04N 5/232* | (2006.01) |
| *H05K 1/02* | (2006.01) |

(52) U.S. Cl.
CPC ..... *G06K 7/10831* (2013.01); *G02B 27/0972* (2013.01); *H04N 5/2253* (2013.01); *H04N 5/2254* (2013.01); *H04N 5/23216* (2013.01); *G06K 2007/10485* (2013.01); *H05K 1/0274* (2013.01)

(58) Field of Classification Search
CPC .................. G06K 7/10831; G02B 27/0972
USPC .......................................................... 235/454
See application file for complete search history.

(56) References Cited

U.S. PATENT DOCUMENTS

| 4,560,862 A * | 12/1985 | Eastman | G06K 7/10811 235/462.22 |
| 8,835,825 B2 * | 9/2014 | Barkan | G06K 7/10722 235/472.01 |
| 9,039,186 B2 * | 5/2015 | Yanai | G03B 21/28 353/22 |
| 9,064,765 B2 * | 6/2015 | Drzymala | H01L 27/14625 |

* cited by examiner

*Primary Examiner* — Michael G Lee
*Assistant Examiner* — David Tardif
(74) *Attorney, Agent, or Firm* — Yuri Astvatsaturov

(57) ABSTRACT

At least some embodiments of the present invention generally relate to the field of optics, and more specifically, to compact optical arrangements for use in imaging engines likes the ones used in handheld barcode readers. In an embodiment, an imaging engine having a field of view (FOV) includes an imaging sensor and an optical lens configured to (i) fold the FOV once between the imaging sensor and an exit window of the imaging engine and/or the window of a barcode reader within which the imaging engine may be implemented, and (ii) correct for field curvature.

31 Claims, 4 Drawing Sheets

OPTICAL ARRANGEMENT FOR USE IN IMAGING ENGINES AND DEVICES USING IMAGING ENGINES

FIELD OF INVENTION

At least some embodiments of the present invention generally relate to the field of optics, and more specifically, to compact optical arrangements for use in imaging engines likes the ones used in handheld barcode readers.

BACKGROUND

Miniaturization of barcode imaging engines is a continued concern. Limited space can become a critical factor for successful integration of such engines into mobile products such as mobile computers. Similarly, evolution in handheld barcode reader designs can be another driving force. Often, the limiting factor in achieving the desired combination of functionality and size lies in the arrangement of the optical components of the imaging engine. Thus, there continues to exist a need for designs directed toward helping reduce the overall size of barcode imaging engines.

SUMMARY

In an embodiment, the present invention is an imaging engine for use in a barcode reader. The imaging engine includes: an optical lens arrangement; a printed circuit board (PCB) positioned relative to the optical lens arrangement; and an imaging sensor positioned on the PCB, the imaging sensor having a plurality of photosensitive elements forming a substantially flat surface, wherein: the optical lens arrangement includes a first lens-sub-arrangement and a second lens-sub-arrangement positioned relative to the first lens-sub-arrangement, the first lens-sub-arrangement includes an optical axis along which there is at least some degree of rotational symmetry in the first lens-sub-arrangement, the first lens-sub-arrangement having a first end and a second end opposite the first end, the second lens-sub-arrangement includes a fold lens, the fold lens having (i) a first side positioned proximate the second end of the first lens-sub-arrangement, the first side configured to refract light incoming along the optical axis into the fold lens along a first path, (ii) a second side configured to reflect the light via total internal reflection (TIR) and redirect the light along a second path, and (iii) a third side positioned within the second path, the third side configured to refract the light directed along the second path out of the fold lens and direct the light toward the imaging sensor, and at least one of the first side of the fold lens, the second side of the fold lens, and the third side of the fold lens is configured to correct for field curvature.

In another embodiment, the present invention is an imaging engine for use in a barcode reader. The imaging engine includes: an optical lens arrangement; a printed circuit board (PCB) positioned relative to the optical lens arrangement; and an imaging sensor positioned on the PCB, the imaging sensor having a plurality of photosensitive elements forming a substantially flat surface, the substantially flat surface defining a first plane, wherein: the optical lens arrangement includes a first lens-sub-arrangement and a second lens-sub-arrangement positioned relative to the first lens-sub-arrangement, the first lens-sub-arrangement includes an optical axis along which there is at least some degree of rotational symmetry in the first lens-sub-arrangement, the first lens-sub-arrangement having a first end and a second end opposite the first end, the second lens-sub-arrangement includes a fold lens, the fold lens having (i) a first side positioned proximate the second end of the first lens-sub-arrangement, the first side configured to refract light incoming along the optical axis into the fold lens along a first path, (ii) a second side configured to reflect the light via total internal reflection (TIR) and redirect the light along a second path, and (iii) a third side positioned within the second path, the third side configured to refract the light directed along the second path out of the fold lens and direct the light toward the imaging sensor, the optical axis is substantially parallel with the first plane.

In still another embodiment, the present invention is a barcode reader that includes: a housing; and an imaging engine secured within the housing, the imaging engine including: an optical lens arrangement; a printed circuit board (PCB) positioned relative to the optical lens arrangement; and an imaging sensor positioned on the PCB, the imaging sensor having a plurality of photosensitive elements forming a substantially flat surface, the substantially flat surface defining a first plane, wherein: the optical lens arrangement includes a first lens-sub-arrangement and a second lens-sub-arrangement positioned relative to the first lens-sub-arrangement, the first lens-sub-arrangement includes an optical axis along which there is at least some degree of rotational symmetry in the first lens-sub-arrangement, the first lens-sub-arrangement having a first end and a second end opposite the first end, the second lens-sub-arrangement includes a fold lens, the fold lens having (i) a first side positioned proximate the second end of the first lens-sub-arrangement, the first side configured to refract light incoming along the optical axis into the fold lens along a first path, (ii) a second side configured to reflect the light via total internal reflection (TIR) and redirect the light along a second path, and (iii) a third side positioned within the second path, the third side configured to refract the light directed along the second path out of the fold lens and direct the light toward the imaging sensor, and the second path of the light is angled between 45 and 135 degrees relative to the optical axis.

In still yet another embodiment, the present invention is an imaging engine for use in a barcode reader. The imaging engine includes: an optical lens arrangement; a printed circuit board (PCB) positioned relative to the optical lens arrangement; and an imaging sensor positioned on the PCB, the imaging sensor having a plurality of photosensitive elements forming a substantially flat surface, wherein: the optical lens arrangement includes a first lens-sub-arrangement and a second lens-sub-arrangement positioned relative to the first lens-sub-arrangement, the first lens-sub-arrangement includes an optical axis along which there is at least some degree of rotational symmetry in the first lens-sub-arrangement, the first lens-sub-arrangement having a first end and a second end opposite the first end, the second lens-sub-arrangement includes a fold lens, the fold lens having (i) a first side positioned proximate the second end of the first lens-sub-arrangement, the first side configured to refract light incoming along the optical axis into the fold lens along a first path, (ii) a second side configured to reflect the light via total internal reflection (TIR) and redirect the light along a second path, and (iii) a third side positioned within the second path, the third side configured to refract the light directed along the second path out of the fold lens and direct the light toward the imaging sensor, and the second lens-sub-arrangement is configured to correct for field curvature.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed examples, and explain various principles and advantages of those embodiments.

Figure 1:
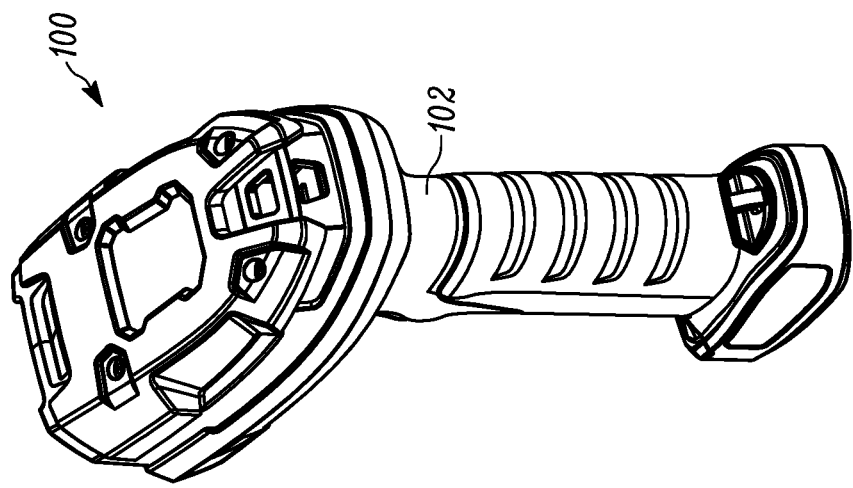
FIG. 1 illustrates a perspective view of an exemplary barcode reader in accordance with the teachings of this disclosure.
Figure 1:
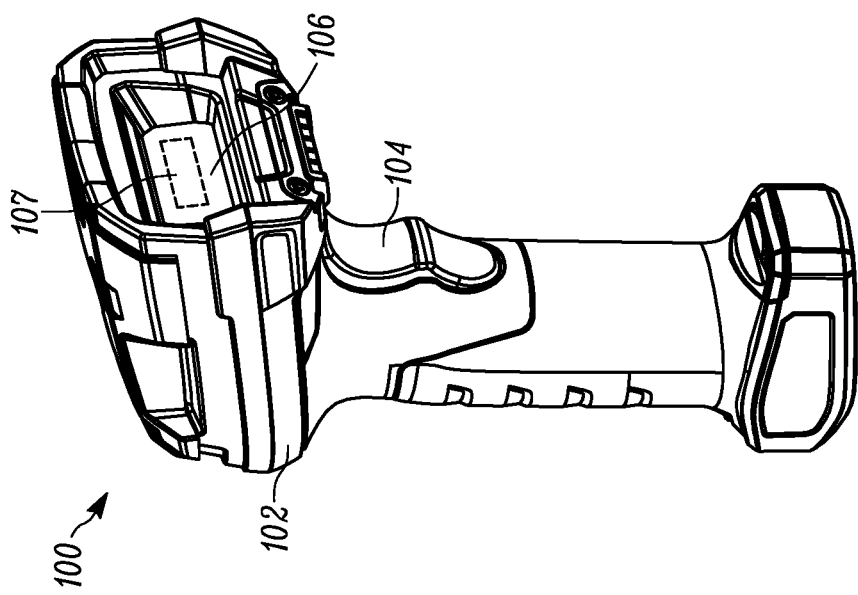

The apparatus and method components have been represented where appropriate by conventional symbols in the drawings, showing only those specific details that are pertinent to understanding the disclosed examples so as not to obscure the disclosure with details that will be readily apparent to those of ordinary skill in the art having the benefit of the description herein.

DETAILED DESCRIPTION

Referring to FIG. 1, shown therein is an example barcode reader 100 having a housing 102 with a cavity for housing internal components, a trigger 104 and a housing window 106. In this example, an example imaging engine 107 is positioned within the cavity of the housing 102 and is configured to capture image data through the housing window 106 and, specifically, to read barcodes (1D and/or 2D) over a working distance range. The imaging engine 107 may be referred to as an imaging engine that includes elements such as, for example, an aiming light assembly, an illumination light assembly, and/or an imaging assembly including optical components and image sensor(s).

The barcode reader 100 can be used in a hands-free mode as a stationary workstation when it is placed on the countertop in a supporting cradle (not shown). The barcode reader 100 can also be used in a handheld mode when it is picked up off the countertop (or any other surface) and held in an operator's hand. In the hands-free mode, products can be slid, swiped past, or presented to the window 106. In the handheld mode, the barcode reader 100 can be aimed at a barcode on a product, and the trigger 104 can be manually depressed to initiate imaging of the barcode. In some implementations, the supporting cradle can be omitted, and the housing 102 can also be in other handheld or non-handheld shapes.

Figure 2:
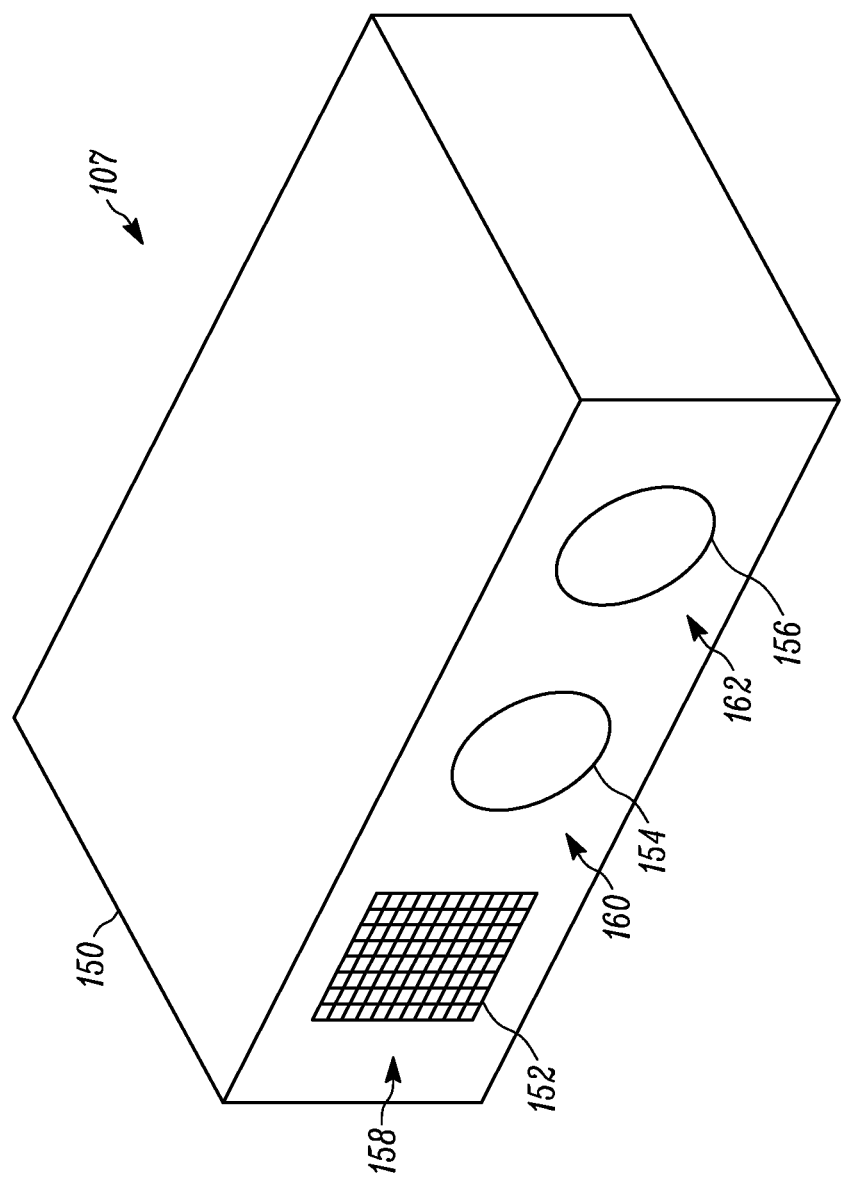
FIG. 2 illustrates an isometric view of an example imaging engine that can be used in the barcode reader of FIG. 1.

FIG. 2 illustrates an isometric view of an exemplary imaging engine 107 that can be used to implement the barcode reader 100 of FIG. 1A. In the illustrated example, the imaging engine 107 includes a housing 150 defining a first aperture 152, a second aperture 154, and a third aperture 156. In some embodiments, apertures 152-156 may include light-transmissive windows positioned therein. This can assist with preventing dust particles from entering the housing 150 and settling on components therein. In some embodiments, the light transmissive windows can be designed to pass light therethrough without alteration; in some other embodiments, the light transmissive windows can include integrated lenses and/or lens-like components designed to alter the trajectory of light normally incident thereon. Housed behind the first aperture 152 and inside the housing 150 is an illumination assembly 158 used to provide illumination light to illuminate targets that are being imaged by the barcode 100. Housed behind the second aperture 154 and inside the housing 150 is an optical arrangement 160 configured to direct light external to the imaging engine 107 in a predefined manner towards an imaging sensor. And housed behind the third aperture 156 and inside the housing 150 is an aiming light assembly 162 configured to provide an aiming light pattern to help the barcode operator visually ascertain the direction of the barcode reader's field of view. If should be understood that components like the housing 150, and elements associated with the illumination assembly 158 and aiming light assembly 162 are merely exemplary and are not necessary for achieving the scope of at least some embodiments of the invention.

Figure 3:
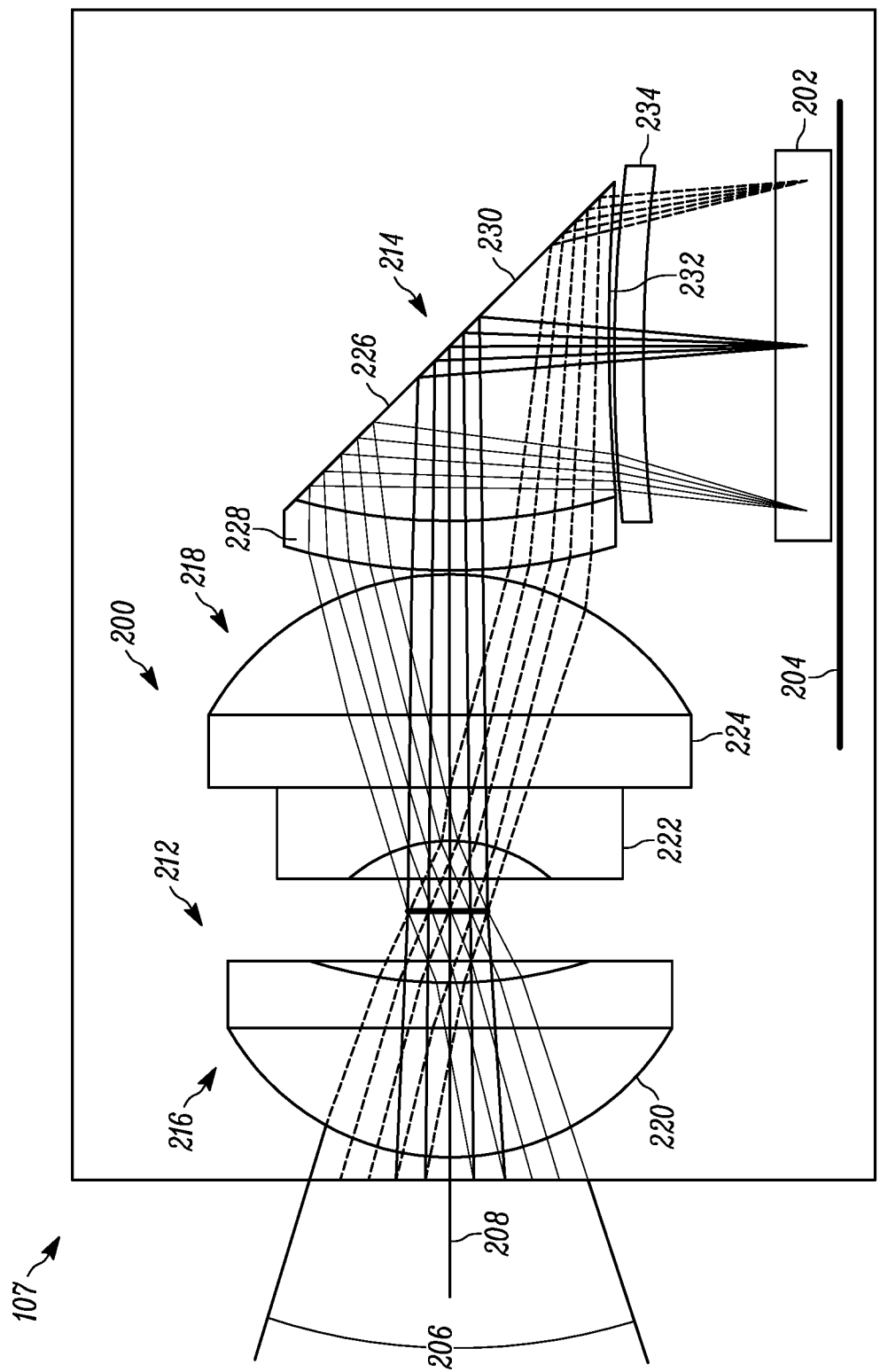
FIG. 3 illustrates a cross-sectional side view of an embodiment of an imaging engine
Figure 4:
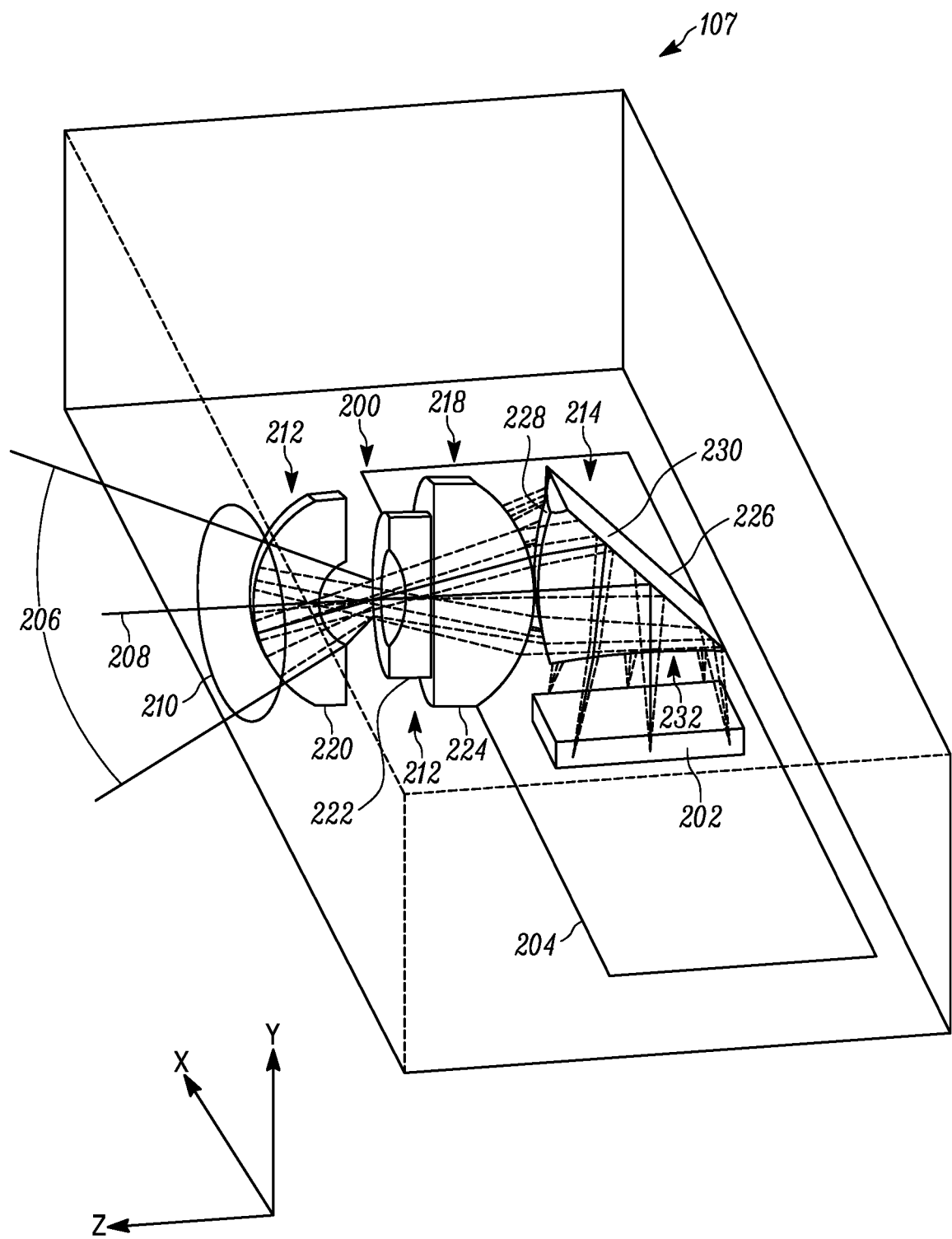
FIG. 4 illustrates a partially cross-sectional perspective view of an embodiment of an imaging engine 107.

FIGS. 3 and 4 illustrate embodiments of an imaging engine and the optical image capture components thereof in greater details. In particular, FIG. 3 illustrates a cross-sectional side view of an embodiment of an imaging engine 107 and FIG. 4 illustrates a partially cross-sectional perspective view of an embodiment of an imaging engine 107. If should be appreciated that not all elements illustrated may be shown to scale, and some elements may be represented schematically. In the illustrated embodiments, the imaging engine 107 includes an optical lens arrangement 200 and an imaging sensor (also referred to as an "imager") 202 positioned on a printed circuit board (PCB) 204. Besides the imaging sensor 202, the PCB may include other circuitry thereon, including, decoding circuitry configured to decode data encoded in an image of a barcode captured by the imaging sensor. The image sensor 202 can be a solid-state device such as, for example, a CCD or a CMOS imager, having a one-dimensional array of addressable photosensitive elements or pixels arranged in a single row, or a two-dimensional array of addressable photosensitive elements or pixels arranged in mutually orthogonal rows and columns forming a substantially flat surface, and operative for detecting incoming light captured by the optical lens arrangement 200 over a field of view (FOV) 206 along an imaging axis 208 through the aperture/window 210. Under typical operation, light is scattered and/or reflected from a to-be-read target (e.g. a barcode) over the FOV and the optical lens arrangement 200 focuses the said light onto the array of photosensitive elements to enable an image of a target to be captured as image data and for that image data to be processed accordingly.

To help maintain a relatively short depth of the imaging engine 107 (as measured in the Z direction), the optical lens arrangement 200 is configured to redirect captured light in a direction of the image sensor 202 positioned below the imaging axis 208. The currently described embodiments achieve this my including a first exemplary lens-sub-arrangement 212 and a second exemplary lens-sub-arrangement 214. The first lens-sub-arrangement 212 includes a first end 216, a second end 218, and an optical axis 208 along which there is at least some degree of rotational symmetry in the first lens-sub-arrangement 212. The in the illustrated example, the first lens-sub-arrangement 212 is made up of a first lens 220 having a positive optical power, a second lens 222 having a negative power, and a third lens 224 having a positive optical power, with the second lens 224 being interposed between the first lens 220 and the third lens 224. Preferably, the first lens 220 and the second lens 222 are plastic molded aspherical lenses, and the third lens 224 is made from a glass material to provide thermal stability for the optical lens arrangement 200. In some embodiments, the first lens 220 is made from a crown-type plastic material with index of refraction between 1.45 and 1.8, and an Abbe value between 46 and 65, the second lens 222 is made from a flint-type material with index of refraction between 1.45 and 1.8, and an Abbe value between 20 and 40, and the third lens 224 is made from a crown glass material with index of refraction between 1.45 and 1.9, and an Abbe value between 50 and 70. In a preferred embodiment, the first lens 220 is made from a crown-type plastic material with index of refraction of about 1.45, and an Abbe value of about 50, the second lens 222 is made from a flint-type material with index of refraction of about 1.6, and an Abbe value of about 25, and the third lens 224 is made from a crown glass material with index of refraction of about 1.76, and an Abbe value of about 52. Once incoming light passes through the first lens-sub-arrangement 212, it encounters the second lens-sub-arrangement 214 which is responsible for redirecting light in the desired direction. It should be appreciated that the second lens-sub-arrangement 214 can be comprised of multiple lens elements (as, for instance, shown in FIG. 3) or just a single lens (as, for instance, shown in FIG. 4). Overall, however, in the illustrated embodiments, the second lens-sub-arrangement 214 includes a fold lens 226 that has three sides. The first side 228 is positioned proximate the second end 218 of the first lens-sub-arrangement 212. It is configured to refract light incoming along the optical axis 208 (along with other incoming light) into the fold lens 226 along a first path, which in the case of the currently described embodiment is substantially collinear with the optical axis 208. The second side 230 is positioned in the path of the refracted light and is configured to reflect the impinging light via total internal reflection, redirecting it along an alternate, second path. In essence, the second side 230 acts as a fold mirror to fold the FOV. In some embodiments, the second side 230 is angled at about 41 degrees relative to the optical axis 208 and/or the first path. In some embodiments, the reflective properties of the second side 230 can be achieved and/or assisted by coating the external surface of the second side 230 with a reflective coating such as, for example, gold, silver, or aluminum. This can be particularly helpful when the angle of the second side 230 relative to the optical axis 208 and/or the first path is less than a TIR angle. While in some embodiments the second side 230 may form a flat surface, in other embodiments it may be symmetrically or irregularly curved to correct for optical aberrations. In still other embodiments, the second side 230 can be free form, it can further have positive or negative optical power(s), and it can be spherical or aspherical. The third side 232 is positioned within the second path and is configured to refract the light directed along that path out of the fold lens 226 and direct it toward the imaging sensor 202. As can be seen, in the embodiment of FIG. 3, upon exiting the fold lens 226, the redirected light further passes through a second lens 234 of the second lens-sub-arrangement 214 which further directs and/or focuses the light on the image sensor 202. It should be understood that the second lens 234 is optional and, as seen in the exemplary embodiment of FIG. 4, in some embodiments, upon exiting the fold lens 226, the redirected light impinges directly on the imaging sensor with no intervening lenses therebetween. In some embodiments, the fold lens 226 has a prism (which is understood to include a trapezoidal prism) shape. Also, in some embodiments, the fold lens 226 is made from a crown or flint-type plastic material with index of refraction between 1.45 and 1.8, and an Abbe value between 20 and 65. In a preferred embodiment, fold lens 226 is made from a crown or flint-type plastic material with index of refraction of about 1.54, and an Abbe value of about 50.

In some embodiments, the second lens-sub-arrangement 214 is configured to correct for field curvature, a phenomenon in which a flat object normal to the optical axis (or a non-flat object past the hyperfocal distance) cannot be brought properly into focus on a flat image plane. This can be achieved by, for example, imparting an appropriately convex shape to any one or more of the first, second, and/or third sides 228, 230, 232 of the fold lens 226. Similarly, an appropriately convex shape may also be imparted to any other optical elements that comprise the second lens-sub-arrangement 214.

When mounting the first lens-sub-arrangement 212 and the second lens-sub-arrangement 214 relative to the imaging sensor 202, both sub-arrangements can be fixedly secured relative to each other and relative to the image sensor 202. Preferably, this is done via a unitary lens holder chassis that can be then secured to, for example, the PCB 204 to fix all the lens components relative to the image sensor 202. In some embodiments, the imaging engine can be a fixed focus imaging engine where the position of the optical lens arrangement 200 relative to the image sensor 202 is adjusted during the manufacturing of the engine. Consequently, in instances where the entire optical lens arrangement 200 is installed in a unitary lens holder chassis, the position of said chassis (along with all optical components therein) can be adjusted along a focusing axis normal to the substantially flat surface of the imaging sensor 202 to appropriately focus light thereon. In the embodiment of FIG. 4, such focusing axis would be parallel with the illustrated Y axis. Upon achieving a sufficient level of focus, the lens holder chassis can then be fixedly secured to, for example, the PCB 204 to fix the position of the optical lens arrangement 200 relative to the image sensor 202 for normal operation. In other embodiments, the imaging engine can be a variable focus imaging engine where the position of at least some components of the optical lens arrangement 200 relative to the image sensor 202 is adjusted during normal operation. In this case, in instances where the entire optical lens arrangement 200 is installed in a unitary lens holder chassis, the position of said chassis (along with all optical components therein) can be adjusted to vary the focus, during normal operation, along the focusing axis by, for example, a piezoelectric motor. In other variable focus embodiments, focusing may be achieved by providing a portion of the first lens-sub-arrangement 212 to be moveable along the optical axis 208. Also, in some embodiments, focusing may be achieved by including a focusing lens as part of the second lens-sub-arrangement and configuring that lens to be movable along the focusing axis. In some embodiments, the movement of any of the focusing components may be effectuated via a microelectromechanical system (MEMS) actuator. In other embodiments, the focusing elements can be implemented via a deformable liquid lens(es).

The embodiments described herein can provide advantageously compact imaging engine implementations and potentially increase PCB area to accommodate other electronic componentry like decoder circuitry and/or imager, illumination, and/or aimer control circuitry.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed:

1. An imaging engine for use in a barcode reader, comprising:
    an optical lens arrangement;
    a printed circuit board (PCB) positioned relative to the optical lens arrangement; and
    an imaging sensor positioned on the PCB, the imaging sensor having a plurality of photosensitive elements forming a substantially flat surface,
    wherein:
        the optical lens arrangement includes a first lens-sub-arrangement and a second lens-sub-arrangement positioned relative to the first lens-sub-arrangement,
        the first lens-sub-arrangement includes an optical axis along which there is at least some degree of rotational symmetry in the first lens-sub-arrangement, the first lens-sub-arrangement having a first end and a second end opposite the first end,
        the second lens-sub-arrangement includes a fold lens, the fold lens having (i) a first side positioned proximate the second end of the first lens-sub-arrangement, the first side configured to refract light incoming along the optical axis into the fold lens along a first path, (ii) a second side configured to reflect the light via total internal reflection (TIR) and redirect the light along a second path, and (iii) a third side positioned within the second path, the third side configured to refract the light directed along the second path out of the fold lens and direct the light toward the imaging sensor, and
        at least one of the first side of the fold lens, the second side of the fold lens, and the third side of the fold lens is configured to correct for a field curvature.

2. The imaging engine of claim 1, wherein the first lens-sub-arrangement incudes a first lens having a positive optical power, a third lens having a positive optical power, and a second lens having a negative optical power and interposed between the first lens and the third lens.

3. The imaging engine of claim 2, wherein:
    the first lens has a refractive index between 1.45 and 1.8;
    the second lens has a refractive index between 1.45 and 1.8; and
    the third lens has a refractive index between 1.45 and 1.9.

4. The imaging engine of claim 2, wherein:
the first lens has an Abbe value between 46 and 65;
the second lens has an Abbe value between 20 and 40; and
the third lens has an Abbe value between 50 and 70.

5. The imaging engine of claim 1, wherein the second lens-sub-arrangement further includes a focusing lens configured to be movable along a focusing axis normal to the substantially flat surface.

6. The imaging engine of claim 1, wherein the fold lens has a prism shape.

7. The imaging engine of claim 1, wherein at least a portion of the first lens-sub-arrangement is moveable along the optical axis to focus an image to be captured by the imaging sensor.

8. The imaging engine of claim 1, wherein each of the first side of the fold lens and the third side of the fold lens is curved, and wherein the second side of the of the fold lens is one of flat or curved.

9. The imaging engine of claim 1, wherein the first lens-sub-arrangement and the second lens-sub-arrangement are fixedly secured relative to each other such that no component of first lens-sub-arrangement is moveable relative to any component of the second lens-sub-arrangement.

10. An imaging engine for use in a barcode reader, comprising:
an optical lens arrangement;
a printed circuit board (PCB) positioned relative to the optical lens arrangement; and
an imaging sensor positioned on the PCB, the imaging sensor having a plurality of photosensitive elements forming a substantially flat surface, the substantially flat surface defining a first plane,
wherein:
the optical lens arrangement includes a first lens-sub-arrangement and a second lens-sub-arrangement positioned relative to the first lens-sub-arrangement,
the first lens-sub-arrangement includes an optical axis along which there is at least some degree of rotational symmetry in the first lens-sub-arrangement, the first lens-sub-arrangement having a first end and a second end opposite the first end,
the second lens-sub-arrangement includes a fold lens, the fold lens having (i) a first side positioned proximate the second end of the first lens-sub-arrangement, the first side configured to refract light incoming along the optical axis into the fold lens along a first path, (ii) a second side configured to reflect the light via total internal reflection (TIR) and redirect the light along a second path, and (iii) a third side positioned within the second path, the third side configured to refract the light directed along the second path out of the fold lens and direct the light toward the imaging sensor,
the optical axis is substantially parallel with the first plane.

11. The imaging engine of claim 10, wherein the first lens-sub-arrangement incudes a first lens having a positive optical power, a third lens having a positive optical power, and a second lens having a negative optical power and interposed between the first lens and the third lens.

12. The imaging engine of claim 10, wherein at least one of the first side of the fold lens, the second side of the fold lens, and the third side of the fold lens is configured to correct for a field curvature.

13. The imaging engine of claim 11, wherein:
the first lens has a refractive index between 1.45 and 1.8, and an Abbe value between 46 and 65;
the second lens has a refractive index between 1.45 and 1.8, and an Abbe value between 20 and 40; and
the third lens has a refractive index between 1.45 and 1.9, and an Abbe value between 50 and 70.

14. The imaging engine of claim 11, wherein:
the fold lens has a refractive index between 1.45 and 1.8, and an Abbe value between 20 and 65.

15. The imaging engine of claim 10, wherein the second lens-sub-arrangement further includes a focusing lens configured to be movable along a focusing axis normal to the substantially flat surface.

16. The imaging engine of claim 10, wherein the fold lens has a prism shape.

17. The imaging engine of claim 10, wherein at least a portion of the first lens-sub-arrangement is moveable along the optical axis to focus an image to be captured by the imaging sensor.

18. The imaging engine of claim 10, wherein each of the first side of the fold lens and the third side of the fold lens is curved, and wherein the second side of the of the fold lens is flat.

19. The imaging engine of claim 10, wherein the first lens-sub-arrangement and the second lens-sub-arrangement are fixedly secured relative to each other such that no component of first lens-sub-arrangement is moveable relative to any component of the second lens-sub-arrangement.

20. The imaging engine of claim 10, wherein the second path of the light is angled between 45 and 135 degrees relative to the optical axis.

21. A barcode reader comprising:
a housing; and
an imaging engine secured within the housing, the imaging engine including:
an optical lens arrangement;
a printed circuit board (PCB) positioned relative to the optical lens arrangement; and
an imaging sensor positioned on the PCB, the imaging sensor having a plurality of photosensitive elements forming a substantially flat surface, the substantially flat surface defining a first plane,
wherein:
the optical lens arrangement includes a first lens-sub-arrangement and a second lens-sub-arrangement positioned relative to the first lens-sub-arrangement,
the first lens-sub-arrangement includes an optical axis along which there is at least some degree of rotational symmetry in the first lens-sub-arrangement, the first lens-sub-arrangement having a first end and a second end opposite the first end,
the second lens-sub-arrangement includes a fold lens, the fold lens having (i) a first side positioned proximate the second end of the first lens-sub-arrangement, the first side configured to refract light incoming along the optical axis into the fold lens along a first path, (ii) a second side configured to reflect the light via total internal reflection (TIR) and redirect the light along a second path, and (iii) a third side positioned within the second path, the third side configured to refract the light directed along the second path out of the fold lens and direct the light toward the imaging sensor, and
the second path of the light is angled between 45 and 135 degrees relative to the optical axis.

22. The barcode reader of claim 21, wherein the first lens-sub-arrangement incudes a first lens having a positive optical power, a third lens having a positive optical power, and a second lens having a negative optical power and interposed between the first lens and the third lens.

23. The barcode reader of claim 21, wherein the second lens-sub-arrangement further includes a focusing lens configured to be movable along a focusing axis normal to the substantially flat surface.

24. The barcode reader of claim 21, wherein the fold lens has a prism shape.

25. The barcode reader of claim 21, wherein at least a portion of the first lens-sub-arrangement is moveable along the optical axis to focus an image to be captured by the imaging sensor.

26. The barcode reader of claim 21, wherein each of the first side of the fold lens and the third side of the fold lens is curved, and wherein the second side of the of the fold lens is flat.

27. The barcode reader of claim 21, wherein the first lens-sub-arrangement and the second lens-sub-arrangement are fixedly secured relative to each other such that no component of first lens-sub-arrangement is moveable relative to any component of the second lens-sub-arrangement.

28. The barcode reader of claim 21, wherein the optical axis is substantially parallel with the first plane.

29. The barcode reader of claim 21, wherein at least one of the first side of the fold lens, the second side of the fold lens, and the third side of the fold lens is configured to correct for a field curvature.

30. An imaging engine for use in a barcode reader, comprising:

an optical lens arrangement;
a printed circuit board (PCB) positioned relative to the optical lens arrangement; and
an imaging sensor positioned on the PCB, the imaging sensor having a plurality of photosensitive elements forming a substantially flat surface,
wherein:
  the optical lens arrangement includes a first lens-sub-arrangement and a second lens-sub-arrangement positioned relative to the first lens-sub-arrangement,
  the first lens-sub-arrangement includes an optical axis along which there is at least some degree of rotational symmetry in the first lens-sub-arrangement, the first lens-sub-arrangement having a first end and a second end opposite the first end,
  the second lens-sub-arrangement includes a fold lens, the fold lens having (i) a first side positioned proximate the second end of the first lens-sub-arrangement, the first side configured to refract light incoming along the optical axis into the fold lens along a first path, (ii) a second side configured to reflect the light via total internal reflection (TIR) and redirect the light along a second path, and (iii) a third side positioned within the second path, the third side configured to refract the light directed along the second path out of the fold lens and direct the light toward the imaging sensor, and
  the second lens-sub-arrangement is configured to correct for a field curvature.

31. The imaging engine of claim 30, wherein the PCB includes decoding circuitry configured to decode data encoded in an image of a barcode captured by the imaging sensor.

* * * * *